(12) United States Patent
Zhang et al.

(10) Patent No.: US 7,927,989 B2
(45) Date of Patent: Apr. 19, 2011

(54) METHOD FOR FORMING A TRANSISTOR HAVING GATE DIELECTRIC PROTECTION AND STRUCTURE

(75) Inventors: Da Zhang, Fishkill, NY (US); Ning Liu, Austin, TX (US); Mohamed S. Moosa, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 577 days.

(21) Appl. No.: 11/829,156

(22) Filed: Jul. 27, 2007

(65) Prior Publication Data

US 2009/0026552 A1    Jan. 29, 2009

(51) Int. Cl.
*H01L 21/336* (2006.01)
*H01L 21/425* (2006.01)

(52) U.S. Cl. ........ 438/524; 438/300; 438/305; 438/528; 257/E21.431

(58) Field of Classification Search .......... 438/299, 438/300, 305, 524, 525, 528; 257/E21.431
See application file for complete search history.

(56) References Cited

U.S. PATENT DOCUMENTS

| 5,908,313 | A  | * | 6/1999  | Chau et al. ............ 438/299 |
| 7,608,515 | B2 | * | 10/2009 | Chen et al. ............ 438/297 |
| 2006/0148220 | A1 | * | 7/2006  | Lindert et al. ........ 438/514 |
| 2007/0298558 | A1 | * | 12/2007 | Yamauchi et al. ..... 438/197 |
| 2009/0068810 | A1 | * | 3/2009  | Tsai et al. ............ 438/300 |

OTHER PUBLICATIONS

Hortsmann et al; "Integration and Optimization of Embedded-SiGe, Compressive and Tensile Stressed Liner Films, and Stress Memorization in Advanced SOI CMOS Technologies"; Electron Devices Meeting, 2005. IEDM Technical Digest. IEEE International Dec. 5-7, 2005 pp. 233-236.

Yamashita et al: "Impact of boron penetration from S/D-extension on gate leakage current and gate-oxide reliability for 65-nm node CMOS and beyond"; Future of Electron Devices, 2004. International Meeting for Jul. 26-28, 2004 pp. 123-124.

* cited by examiner

*Primary Examiner* — Shouxiang Hu

(74) *Attorney, Agent, or Firm* — James L. Clingan, Jr.; Robert L. King

(57) ABSTRACT

A transistor structure is formed by providing a semiconductor substrate and providing a gate above the semiconductor substrate. The gate is separated from the semiconductor substrate by a gate insulating layer. A source and a drain are provided adjacent the gate to define a transistor channel underlying the gate and separated from the gate by the gate insulating layer. A barrier layer is formed by applying nitrogen or carbon on opposing outer vertical sides of the transistor channel between the transistor channel and each of the source and the drain. In each of the nitrogen and the carbon embodiments, the vertical channel barrier retards diffusion of the source/drain dopant species into the transistor channel. There are methods for forming the transistor structure.

8 Claims, 4 Drawing Sheets

METHOD FOR FORMING A TRANSISTOR HAVING GATE DIELECTRIC PROTECTION AND STRUCTURE

BACKGROUND

1. Field

This disclosure relates generally to semiconductor device structures, and more specifically, to protection of the gate dielectric in transistors.

2. Related Art

Boron penetration into gate dielectrics has been a long standing problem. The boron can come from either the gate side or the channel side. The gate side has generally been the greater problem because of the relatively higher boron concentration. This has been obviated in large measure through techniques using nitrogen or other blocking species such as carbon in the gate or at the top surface of the gate dielectric. Thinner gate dielectrics are desirable for improved transistor performance but are now resulting in an increased susceptibility to boron penetration from the channel side, especially from the source/drains of P channel transistors. Boron penetration has the effect of significantly increasing leakage and subsequently reducing the life of the device. Both gate dielectric leakage and device lifetime issues are important to be resolved in transistor development Thus, there is a need for reducing the presence of boron on the channel side of a gate dielectric while avoiding a significant reduction in device performance or at least while maintaining acceptable device performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device is made by forming a gate stack, which is over a semiconductor layer that is used as a mask in recessing the semiconductor layer leaving a semiconductor pillar under the gate stack. Sidewalls of the pillar are doped with nitrogen, or some other dopant blocking species, to form a dopant blocking layer inside the pillar along its sidewall. The recesses are filled with semiconductor material for use as source/drains. There is then a completed transistor having a gate stack over the semiconductor layer that functions as a channel that has at its ends a dopant blocking layer. The dopant blocking layer, which preferably contains nitrogen or carbon for the case where the source/drains have boron as the dopant, which is the typical case for P channel transistors. This is better understood with reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above. In any case there is in affect a semiconductor layer for use in forming a transistor.

Figure 1:
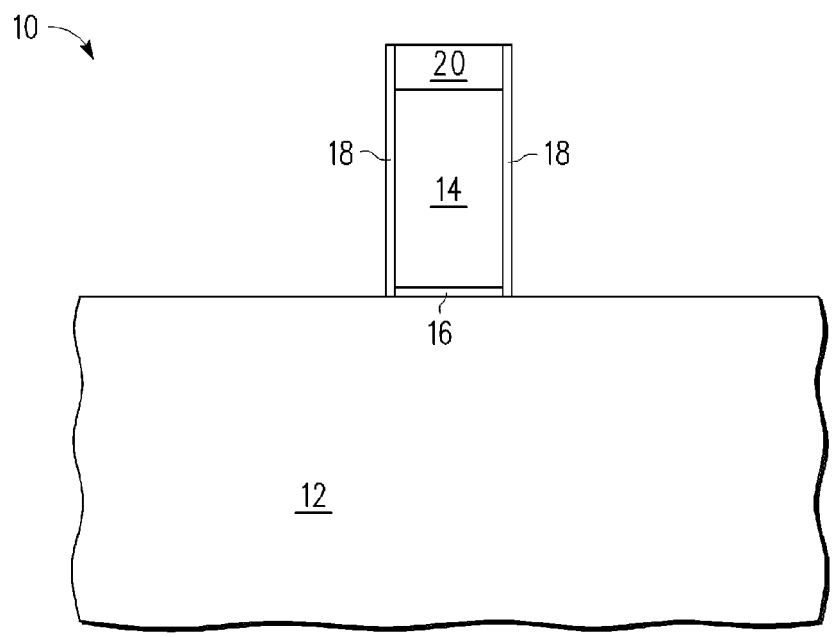
FIG. 1 is a cross section of a semiconductor device at a stage in a process according to an embodiment.

Shown in FIG. 1 is a semiconductor device 10 comprising a semiconductor substrate 12, gate electrode 14 over semiconductor substrate 12, a gate dielectric 16 between gate electrode 14 and semiconductor substrate 12, and a cap 20 over gate electrode. Cap 20 and gate electrode 14 can together be considered a gate stack. Semiconductor device 10 as shown in FIG. 1 also comprises a sidewall spacer 18 that is around the gate stack. Sidewall spacer 18 is preferably relatively thin, about a tenth of a width of gate electrode 14. Gate electrode 14 may be polysilicon or another conductive material or materials. Gate dielectric 16 may be silicon oxide, silicon oxynitride, a high k dielectric material, or a stack of multiple dielectric materials. One of many examples of a high k dielectrics is hafnium oxide. Semiconductor substrate 12 in this example is preferably silicon but could be other semiconductor materials. Sidewall spacer 18 is preferably of nitride and may be formed in conventional deposition and etch back fashion but could be another material or stack of materials and could be formed in another manner. Cap 20 is preferably nitride but could be a different material and may not be required.

Figure 2:
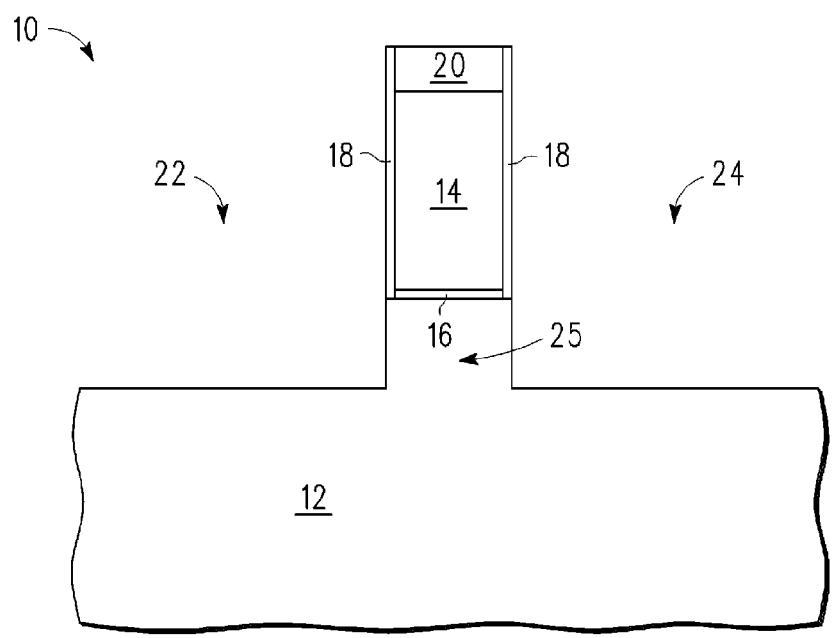
FIG. 2 is the semiconductor device of FIG. 1 at a subsequent stage in the process.

Shown in FIG. 2 is a semiconductor device 10 after an etch using the gate stack and sidewall spacer as a mask resulting in recesses 22 and 24 adjacent to the gate stack and aligned to sidewall spacer 18. Semiconductor substrate 12 is not etched under the gate stack so that a pillar 25 of semiconductor material from substrate 12 remains under the gate stack. Pillar 25 has sidewalls that are exposed adjacent to recesses 22 and 24. The etch is chosen to be a selective etch, which may be isotropic or anisotropic, that etches silicon selective to oxide and nitride. Such etches are well known in the art.

Figure 3:
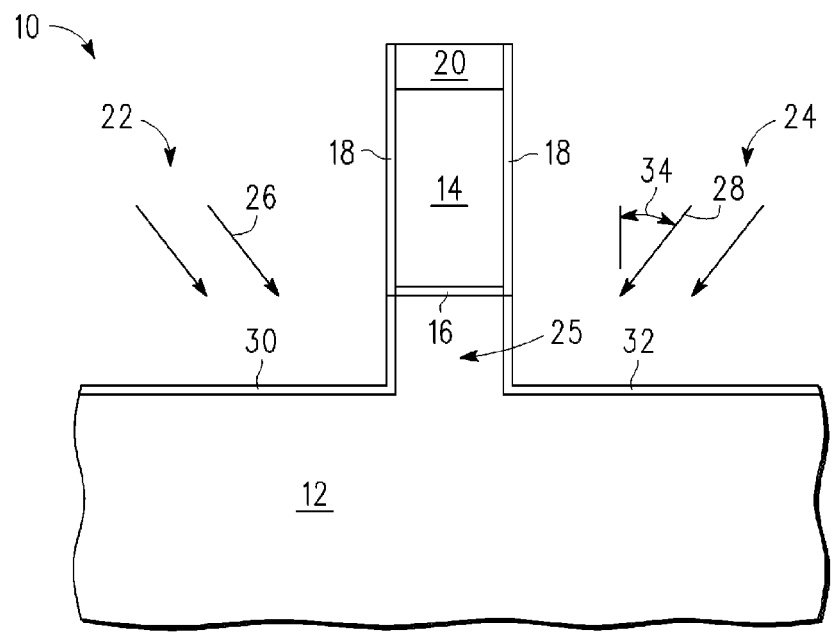
FIG. 3 is the semiconductor device of FIG. 2 at a subsequent stage in the process.

Shown in FIG. 3 is semiconductor device 10 after angled implants 26 and 28. Angled implant 26 forms barrier layer 30 in recess 22 so that it is formed in substrate 12 along the bottom of recess 22 and in pillar 25 along the sidewall of pillar 25 that is in common with a side of recess 22. Similarly, angled implant 28 forms barrier layer 32 in recess 24 so that it is formed in substrate 12 along the bottom of recess 24 and in pillar 25 along the sidewall of pillar 25 that is in common with a side of recess 24. Angled implants 26 and 28 are preferably of nitrogen. For implanting the nitrogen is preferably in the form of nitrogen atoms (n+) that are ionized. Barrier layers 30 and 32 are thus nitrogen doped layers that are effective in retarding boron diffusion. Carbon is another implant species that may be used for forming barrier layers 30 and 32 for retarding boron diffusion. Angled implant 28 is shown as being at an angle 34 relative to vertical and toward the sidewall of pillar 25 that is in common with the side of recess 24. Angled implant 26 is at the same angle 34 with respect to vertical but in the direction of the sidewall of pillar 25 that is in common with the side of recess 22. In this example, angle 34 is shown as being at 45 degrees so that barrier layers 30 and 32 are the same thickness in substrate 12 and pillar 25. Angle 34 may vary. The angle of 45 degrees may be too far from vertical because of possible shadowing effects from other gate stacks for transistors that are in close proximity to each other. An angle that has been found to be effective for halo implants has been 30 degrees from vertical that avoids shadow problems. If 30 degrees is used, layers 30 and 32 would be thicker in substrate 12 than in pillar 25. An effective resulting concentration for a boron barrier has been found to be 1e19 (one times ten to the nineteenth) atoms per cubic centimeter. Implants 26 and 28 thus preferably have a sufficient dose to provide the desired 1e19 atoms per cubic centimeter. In this example, the thickness of barrier layers 30 and 32 is about 60 Angstroms but another thickness may be chosen. The surface concentration may be chosen to be less than the 1e19 atoms per cubic centimeter and the inner concentration be at or above 1e19. Being below 1e19 atoms per cubic centimeter may be beneficial for a subsequent growth of semiconductor material. An optional anneal process can be performed after the implantations to improve the surface crystallinity.

Figure 4:
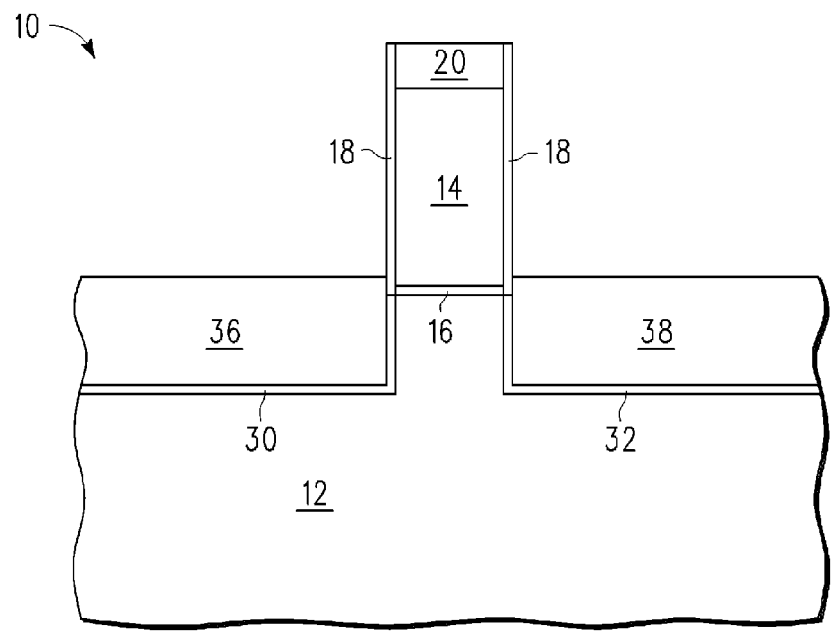
FIG. 4 is the semiconductor device of FIG. 3 at a subsequent stage in the process.

Shown in FIG. 4 is semiconductor device 10 after epitaxially growing semiconductor layer 36 in recess 22 on barrier layer 30 and semiconductor layer 38 in recess 24 on barrier layer 32. For a P channel transistor semiconductor layers 36 and 38 are preferably silicon germanium to provide stress to the channel for forming a P channel transistor. Growing semiconductor layers of SiGe into recesses adjacent to the channel are known for improving P channel performance. Thus, the known benefit of improving P channel performance with a stressor can be conveniently used in combination with barrier layers 30 and 32 for reducing boron penetration. The stressors lose some of their effectiveness if there are defects in the crystalline structure which is the primary reason for keeping the surface concentration of barrier layers 30 and 32 below 1e19 atoms per cubic centimeter. If the stressor aspect is not considered important, the surface concentration becomes less significant so that the 1e19 concentration of nitrogen may be exceeded at the surface. Semiconductor layers 36 and 38 are preferably in situ doped with boron for use as source/drain extensions for a P channel transistor.

Figure 5:
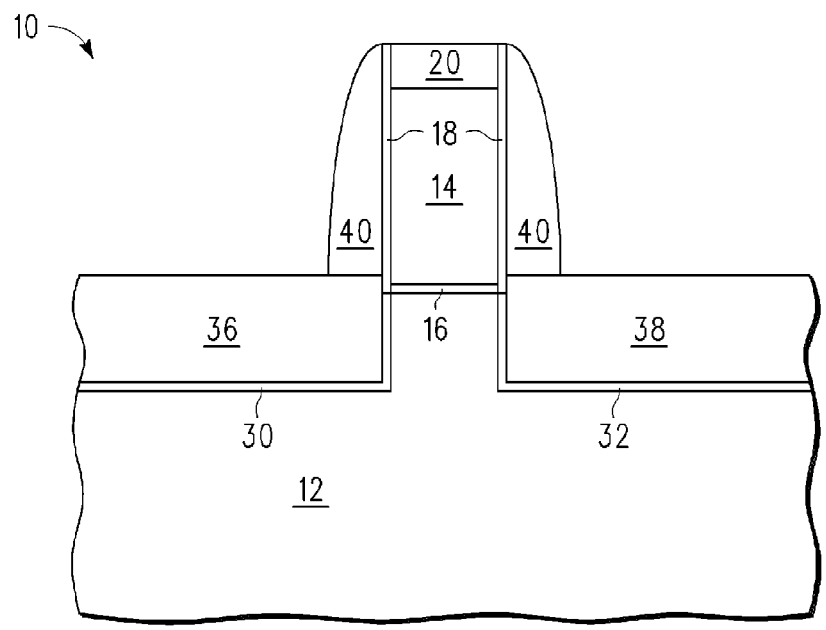
FIG. 5 is the semiconductor device of FIG. 4 at a subsequent stage in the process.

Shown in FIG. 5 is semiconductor device 10 after forming a sidewall spacer around sidewall spacer 18 and thus also around the gate stack. Sidewall spacer 40 is preferably nitride with an oxide liner but may be another material or materials.

Figure 6:
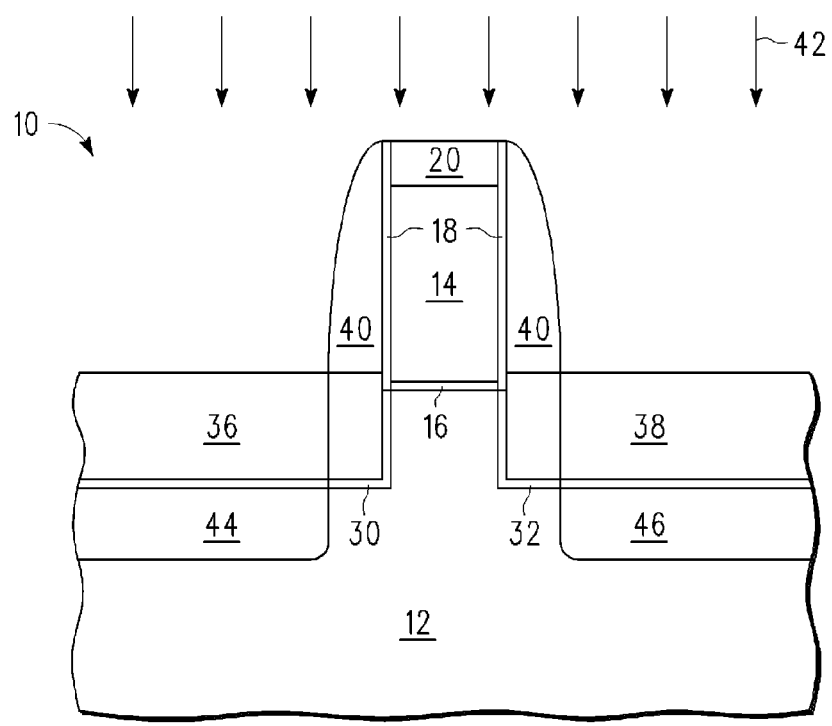
FIG. 6 is the semiconductor device of FIG. 5 at a subsequent stage in the process.

Shown in FIG. 6 is semiconductor device 10 after an implant 42, using sidewall spacer 40 as a mask, has formed deep source/drain region 44 in substrate 12, barrier 30, and semiconductor layer 36 and deep source/drain region 46 in substrate 12, barrier 32, and semiconductor layer 38.

Figure 7:
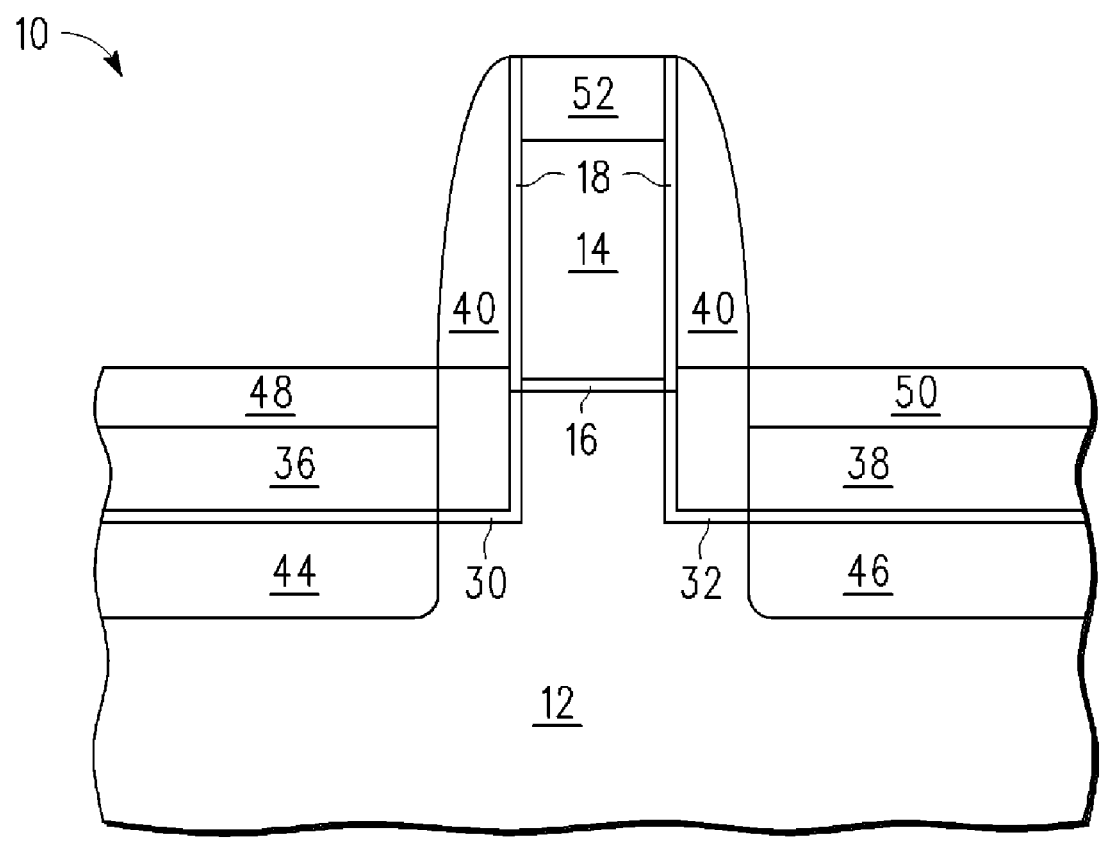
FIG. 7 is the semiconductor device of FIG. 6 at a subsequent stage in the process.

Shown in FIG. 7 is semiconductor device 10 after removing cap 20, which causes sidewall spacers 18 and 40 to recede, and forming a silicide region 48 in deep source/drain region 44, and a silicide region 50 in deep source/drain region 46, and a silicide region 52 in gate electrode 14. This shows a completed transistor with the enhanced barrier to boron penetration provided by barrier layers 30 and 32 so that gate dielectric 16 is protected. This also shows that the benefit of electrically contacting the source/drains and gate with silicide is achieved while also having the gate dielectric protected with barrier regions. As shown in FIG. 7, boron penetration is obstructed by barrier layers 30 and 32. If there is difficulty with gate electrode 14 providing enough coupling to provide inversion of the channel between semiconductor layers 36 and 38, an isotropic etch can be performed on pillar 25 as shown in FIG. 2 to thin pillar 25 to ensure there is enough overlap between gate electrode 14 and semiconductor layers 36 and 38 to invert the whole channel. Barrier layers 30 and 32 introduce a small additional resistance which can provide some reduction in transistor performance. This adverse effect is reduced by reducing the thickness of barrier layers 30 and 32. Even just 5 Angstroms has been found to be effective for acting as a significant barrier to boron penetration. The thickness chosen for barriers 30 and 32 thus takes into account the degree to which boron penetration must be stopped, the need for the surface concentration to be below 1e19 atoms per centimeter cubed, and the significance of the resistance added by barriers 30 and 32.

By now it should be appreciated that there has been provided a method of forming a transistor that includes providing a semiconductor substrate. The method further includes forming a gate stack comprising a gate electrode, the gate electrode overlying a gate dielectric formed in direct contact with a predetermined portion of the semiconductor substrate. The method further includes forming a sidewall dielectric layer along sidewalls of the gate dielectric and the gate electrode. The method further includes forming recesses in the semiconductor substrate adjacent the gate stack to leave a semiconductor pillar under the gate stack. The method further includes forming recesses in the semiconductor substrate adjacent the gate stack to leave a semiconductor pillar under the gate stack. The method further includes applying a diffusion-retarding species to form a barrier region on exposed portions of the semiconductor substrate and on sidewalls of the semiconductor pillar. The method further includes forming source and drain regions laterally adjacent and in contact with the barrier region that is on the sidewalls of the semiconductor pillar, the source and drain regions overlying the semiconductor substrate. The method further includes forming electrical contacts to the gate and the source and drain regions of the transistor. The method may further include forming the source and drain regions with in situ doping during an epitaxy process. The method may further include forming the source and drain regions with a stressor material to provide stress to the channel of the transistor. The method may further include forming the source and drain regions by epitaxially growing the source and drain regions. The method may be further characterized by the step of applying the diffusion-retarding specie being performed by implanting the recesses. The method may be further characterized by the step of applying the diffusion-retarding species further characterized as angle implanting with nitrogen. The method may be further characterized by applying the diffusion-retarding species further comprises angle implanting with carbon.

Also, a method of forming a transistor includes providing a semiconductor substrate. The method further includes providing a gate above the semiconductor substrate and separated from the semiconductor substrate by a gate insulating layer. The method further includes providing a source and a drain adjacent the gate to define a transistor channel underlying the gate and separated from the gate by the gate insulating layer. The method further includes providing a barrier layer on opposing outer vertical sides of the transistor channel between the transistor channel and each of the source and the drain, the barrier layer comprising a diffusion-retarding species to impede migration of a dopant species from each of the source and the drain into the transistor channel. The method may further include providing the barrier layer as a nitrogen-rich region formed by exposing sides of the transistor channel and angle implanting a nitrogen species dopant into the sides of the transistor channel. The method may further include providing the barrier layer as a carbon-rich region formed by exposing sides of the transistor channel and angle implanting a carbon species dopant into the sides of the transistor channel. The method may be further characterized by the step of providing the source and drain further including forming a first stressor region by epitaxial growth to form a portion of the source and forming a second stressor region by epitaxial growth to form a portion of the drain. The method may be further characterized by the step of providing the source and the drain further comprising etching the semiconductor substrate adjacent the gate to form a recess in the semiconductor substrate on either side of the gate thereby forming a pillar under the gate from the semiconductor substrate and epitaxially growing silicon germanium in each recess to form the source and the drain. The method may further include forming a gate sidewall dielectric around the gate prior to providing the barrier layer. The method may further include forming a sidewall spacer adjacent the gate implanting the source and drain with the dopant species to form source and drain extension regions, the dopant species comprising boron. The method may further characterized by the step of providing include the barrier layer on opposing outer vertical sides of the transistor channel between the transistor channel and each of the source and the drain further comprises forming a barrier layer having nitrogen in an amount of substantially $10^{19}$ nitrogen atoms per cubic centimeter. The method may be further characterized by the step of forming the source and drain further includes forming in situ doped regions by epitaxial growth. The method may further include providing the doping species with an electrical conductivity to form a P-channel transistor.

Further a transistor comprises a semiconductor substrate. The transistor further comprises a gate stack overlying the semiconductor substrate and comprising a gate dielectric and an overlying gate. The transistor further comprises a channel underlying the gate and the gate dielectric, the channel comprising opposing vertical sides. The transistor further comprises a barrier layer adjacent each of an outer edge of the opposing vertical sides of the channel, the barrier layer comprising a dopant blocking species to impede migration of a dopant species. The transistor further comprises a source and a drain adjacent opposing sides of the channel and separated from the channel by the barrier layer, each of the source and the drain comprising the dopant species. The transistor may be further characterized by the barrier layer further comprising a layer having a predetermined concentration of nitrogen. The transistor may be further characterized by the barrier layer further comprising a layer having a predetermined concentration of carbon.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, instead of angled implants for forming barrier layers 30 and 32, a nitrogen plasma may be introduced to semiconductor device 10 as shown in FIG. 2 so that nitrogen will penetrate into the sidewalls of pillar 25 and form barrier layers 30 and 32 in that manner. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a transistor comprising:
   providing a semiconductor substrate;
   forming a gate stack comprising a gate electrode, the gate electrode overlying a gate dielectric formed in direct contact with a predetermined portion of the semiconductor substrate, the gate electrode having a width;
   forming a relatively thin sidewall spacer dielectric layer along sidewalls of the gate dielectric and the gate electrode, wherein the relatively thin sidewall spacer dielectric layer has a thickness of about a tenth of the width of the gate electrode;
   forming recesses in the semiconductor substrate using an anisotropic etch using the relatively thin sidewall dielectric as a mask to leave a semiconductor pillar under the gate stack, whereby the semiconductor pillar has sidewalls vertically aligned to the relatively thin sidewall dielectric layer;
   implanting a species comprising one of a group consisting of carbon and nitrogen to form a boron barrier region on exposed portions of the semiconductor substrate and on sidewalls of the semiconductor pillar;
   after implanting the species, growing source and drain regions in the recesses that are in situ doped with boron;
   after growing the source and drain regions, forming relatively thick sidewall spacers adjacent to the thin sidewall spacer dielectric;
   implanting boron into portions of the source drain regions using the relatively thick sidewall spacers as a mask; and
   forming electrical contacts to the gate and the source and drain regions of the transistor.

2. The method of claim 1,
   wherein the growing is an epitaxy process.

3. The method of claim 1,
   wherein the growing the source and drain regions comprises forming a stressor material to provide stress to the channel of the transistor.

4. The method of claim 1 wherein the step of implanting a species is further characterized as angle implanting with nitrogen.

5. The method of claim 1 wherein the step of implanting a species is further characterized as angle implanting with carbon.

6. A method of forming a transistor, comprising:
   providing a semiconductor substrate;
   providing a gate above the semiconductor substrate and separated from the semiconductor substrate by a gate insulating layer, wherein the gate has a width;
   providing a relatively thin sidewall spacer dielectric layer along sidewalls of the gate insulating layer and the gate electrode, wherein the relatively thin sidewall spacer dielectric layer has a thickness of about a tenth of the width of the gate electrode;
   etching the semiconductor substrate using the gate electrode and relatively thin sidewall spacer dielectric layer as a mask to form a source recess and a drain recess in the substrate;
   performing an angled implant with one of a group consisting of nitrogen and carbon to form a diffusion barrier at a surface of the source recess and at a surface of the drain recess;
   epitaxially growing, on the diffusion barrier, a semiconductor drain in situ doped with boron in the drain recess and a semiconductor source in situ doped with boron in the source recess;
   after epitaxially growing, forming relatively thick sidewall spacers on the relatively thin sidewall spacer dielectric; and implanting boron into a portion of the semiconductor drain and into a portion of the semiconductor source using the relatively thick sidewall spacers as a mask.

7. The method of claim 6 wherein the epitaxially growing comprises:
epitaxially growing silicon germanium.

8. The method of claim 6 wherein the performing an angled implant comprises forming the diffusion barrier to have a nitrogen concentration in an amount of substantially $10^{19}$ nitrogen atoms per cubic centimeter.

* * * * *